United States Patent [19]
Sung

[11] Patent Number: 6,121,136
[45] Date of Patent: Sep. 19, 2000

[54] METHOD OF FORMING CONTACT PLUG

[75] Inventor: Shu-Jeng Sung, I-Lan, Taiwan

[73] Assignee: United Microelectronics Corp., Hsinchu, Taiwan

[21] Appl. No.: 09/146,582

[22] Filed: Sep. 3, 1998

[30] Foreign Application Priority Data

May 22, 1998 [TW] Taiwan .................................. 87107993

[51] Int. Cl.⁷ ...................................................... H01L 21/44

[52] U.S. Cl. ........................... 438/672; 438/631; 438/624; 438/926

[58] Field of Search ..................................... 438/624, 631, 438/672, 926

[56] References Cited

U.S. PATENT DOCUMENTS 5,202,275  4/1993  Sugiura et al. ........................... 437/41

*Primary Examiner*—John F. Niebling
*Assistant Examiner*—David A Zarneke
*Attorney, Agent, or Firm*—Thomas, Kayden, Horstemeyer & Risley

[57] ABSTRACT

A method of forming a contact plug. A dummy pattern with an uneven surface is formed on a region of the substrate. A dielectric layer with an opening exposing a part of the substrate is formed on the dummy pattern and the substrate. A first wiring layer is formed on the dielectric layer and to fill the opening. A sandwich type spin-on-glass layer is formed on the first wiring layer. An opening penetrating through the sandwich type dielectric layer is formed, and the opening is filled with a contact plug.

13 Claims, 7 Drawing Sheets

METHOD OF FORMING CONTACT PLUG

CROSS-REFERENCE TO RELATED APPLICATION

This application claims the priority benefit of Taiwan application serial no. 87107993, filed May 22, 1998, the full disclosure of which is incorporated herein by reference.

BACKGROUND OF THE INVENTION

1. Field of the Invention

The invention relates in general to a method of removing a silicon-on-glass residue, and more particularly, to a method of preventing the contact window from being poisoned by the residue of silicon-on-glass.

2. Description of the Related Art

Contacts have been widely applied as the multi-level interconnects between integrated circuits or semiconductor devices. In a conventional method for forming a contact, a inter-metal dielectric layer (IMD) is formed on a first wiring layer. The inter-metal dielectric layer has an opening therewithin to expose a part of the first wiring layer. A conductive layer is formed to fill the opening as a contact plug as for the interconnection between the first wiring layer and a second wiring layer formed thereafter.

Typically, the inter-metal dielectric layer comprises layers of spin-on-glass layers. Spin-on-glass is a common planarization technique to form a relative flat layer. The process comprises dissolving dielectric material into a solvent, and using spin-coating technique to cover the material on a wafer. Since the dielectric material is circulated on the wafer with the solvent, the uneven recessed surface of the wafer are easily filled with the dielectric to obtain a planarized surface. After thermal treatment, the solvent is removed to cure the dielectric material as a spin-on-glass layer. A local planarization is thus achieved. Therefore, the technique of spin-on-glass is advantageous to gap filling for preventing the formation of a void while depositing a dielectric layer.

The sandwich type spin-on-glass layer is widely applied in semiconductor process. FIG. 1A to FIG. 1F are cross sectional views showing a conventional method for forming the interconnect with a sandwich type spin-on-glass layer as an inter-metal dielectric layer. In FIG. 1A, a semiconductor substrate 100 comprising a metal-oxide semiconductor (MOS) which further comprises a gate 105 and a source/drain region 108 and an isolation structure 102 is provided. A dielectric layer 122 with an opening 124 exposing the source/drain 108 is formed to cover the whole substrate 100. The opening 124 is filled with a part of a first wiring layer 126 which comprises metal layers 126a, 126b, 126c and 126d. As shown in the figure, according to the topography of the substrate, the first wiring layer 126 has an uneven surface level. In addition, the metal layers 126a, 126b, 126c and 126d of the first wiring layer 126 are different in surface area.

In FIG. 1B, a dielectric layer 128 is formed on the dielectric layer 122 and the first wiring layer 126. The dielectric layer 128 has uneven surface level due to the topography of the first wiring layer 126. That is, according to the topography of the first wiring layer 126, some gaps or recesses are formed. On the dielectric layer 128, a spin-on-glass layer 132 is formed for gap filling.

In FIG. 1C, the spin-on-glass layer 132 is etched back until the dielectric layer 128 is exposed. The remaining spin-on-glass layer 132a is expected to fill the gaps 130 only. However, it is very likely that a part of the spin-on-glass 132a also remains on the more planar surface of the dielectric layer 128, that is, on the portion of dielectric layer 128 which has a larger surface area on the metal layer 126d.

In FIG. 1D, a dielectric layer 134 is further formed to cover the dielectric layer 128 and the remaining spin-on-glass layer 132a. The dielectric layer 128, the spin-on-glass layer 132a, and the dielectric layer 134 compose a sandwich type spin-on-glass layer.

In FIG. 1E, to achieve the interconnection between the first wiring layer 126 and the second wiring layer formed thereafter, the sandwich type layer is patterned to form openings 136, 138, 140a, 140b, and 140c which expose parts of the underlying first wiring layer 126 by photolithography and etching process. As shown in the figure, a part of the remaining spin-on glass layer 132a is exposed on the side walls of the openings 140a, 140b, and 140c which expose the metal layer 126d. As mentioned above, the spin-on-glass layer 132a is formed from curing the solution containing dielectric material. Therefore, it is very often that the solvent is not removed completely during curing process. Or during the photolithography and etching process for patterning the openings 140a, 140b, and 140c, the remaining spin-on-glass layer 132a is very easy to absorb moisture. For either the remaining spin-on-glass layer 132a to containing solvent or moisture, the contained solvent or moisture evaporates, namely, the spin-on-glass layer 132a outgases, in a higher temperature.

In FIG. 1F, a metal layer 142 is formed to fill the openings 136, 138, 140a, 140b, and 140c to form contact plugs. The temperature for forming the metal layer 142 is typically so high to cause the solvent or moisture contained in the spin-on-glass layer 132a to evaporate, that is, the spin-on-glass layer 132a to outgas. The metal layer 142 is thus filled with gas void 144 evaporated from the solvent or the moisture absorbed by the spin-on-glass layer 132a. The metal layer 142 is thus poisoned. Since the metal layer 142 is formed to electrically connect the first wiring layer 126 and a second wiring layer formed thereafter, with the formation of the gas voids 144, a poor conductivity is obtained. Therefore, the quality of the device is degraded.

On the other hand, the remaining spin-on-glass layer 132a on the metal layer 126d causes the aspect ratio of forming a contact plug to increase. The higher the aspect ratio is, the poorer the step coverage is while depositing the metal layer 142. As a result, an air void 146 as shown in the figure is formed.

SUMMARY OF THE INVENTION

It is an object of the invention to provide a method of preventing the contact plug from being poisoned. During the formation of a contact plug, the spin-on-glass layer is not exposed. Therefore, the outgas phenomenon is avoided. In addition, the aspect ratio of forming the contact plug is reduced by preventing the spin-on-glass layer from remaining on any unwanted surface area.

To achieve the above-mentioned object and advantages, a method for preventing a contact plug on a semiconductor substrate from being poisoned. A dummy pattern with an uneven surface is formed on a region of the substrate. Preferably, the region of the substrate has a substantially flat surface. A dielectric layer with an opening which exposes a part of the substrate is formed on the dummy pattern and the substrate. A first wiring layer is formed on the dielectric layer and to fill the opening. A sandwich type spin-on-glass layer is formed on the first wiring layer. An opening penetrating through the sandwich type dielectric layer is formed, and the opening is filled with a contact plug.

Both the foregoing general description and the following detailed description are exemplary and explanatory only and are not restrictive of the invention, as claimed.

DESCRIPTION OF THE PREFERRED EMBODIMENTS

It has been mentioned that while using a sandwich type spin-on-glass layer as an inter-metal dielectric layer, a contact plug for interconnecting two metal layers is poisoned by the outgas of the exposed spin-on-glass layer. The exposed spin-on-glass layer is actually an unwanted residue remaining on a flat surface of the first metal layer. In the invention, on the region of the substrate for forming a metal layer with a flat surface, a dummy pattern is formed. The dummy pattern has an uneven surface. The metal layer is then formed on the uneven surface of the dummy pattern. Therefore, the metal layer formed with a flat surface is replaced by forming a metal layer with an uneven surface on the dummy pattern. The uneven surface of the metal layer causes the spin-on-glass layer to fill the recess regions of the metal layer without remaining on the surface area.

Figure 1A:
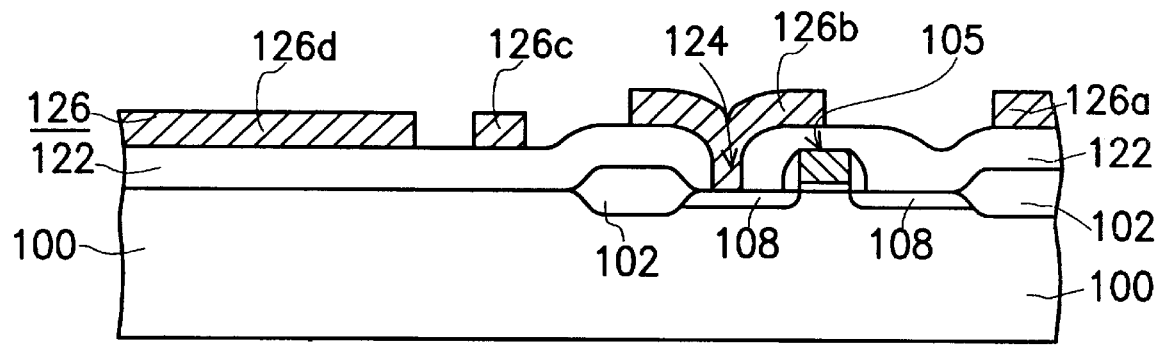
FIG. 1A to FIG. 1F are cross sectional views showing a conventional method of forming a contact plug.
Figure 1B:
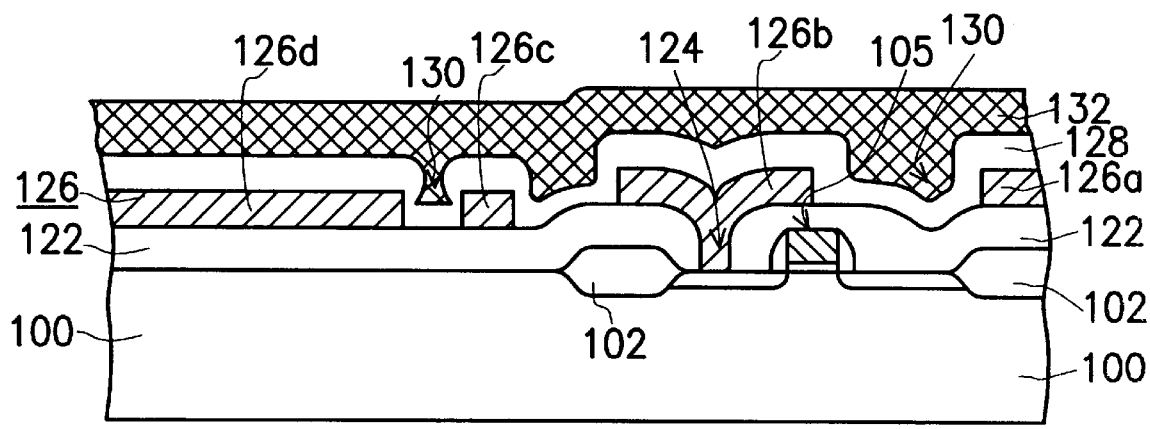
Figure 1C:
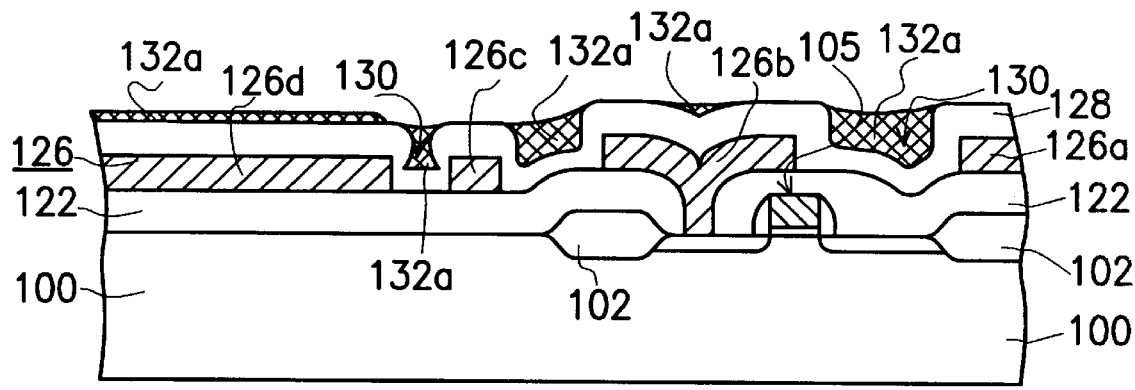
Figure 1D:
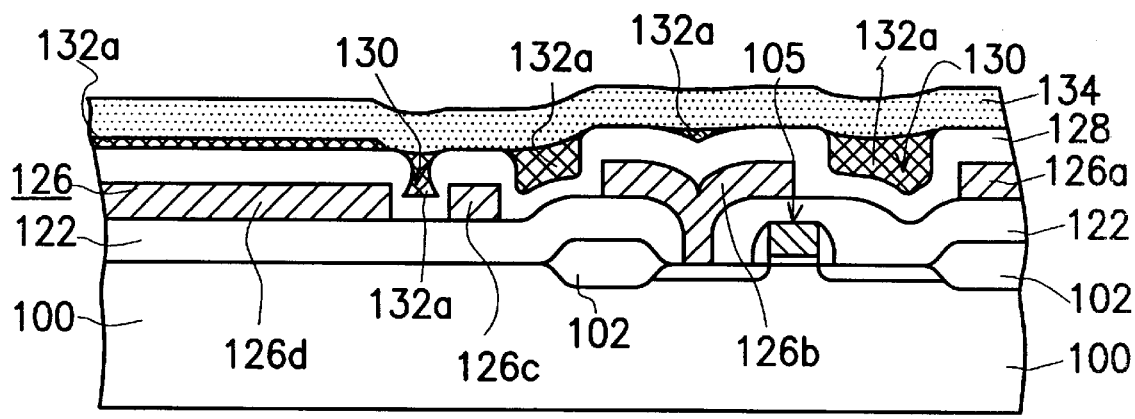
Figure 1E:
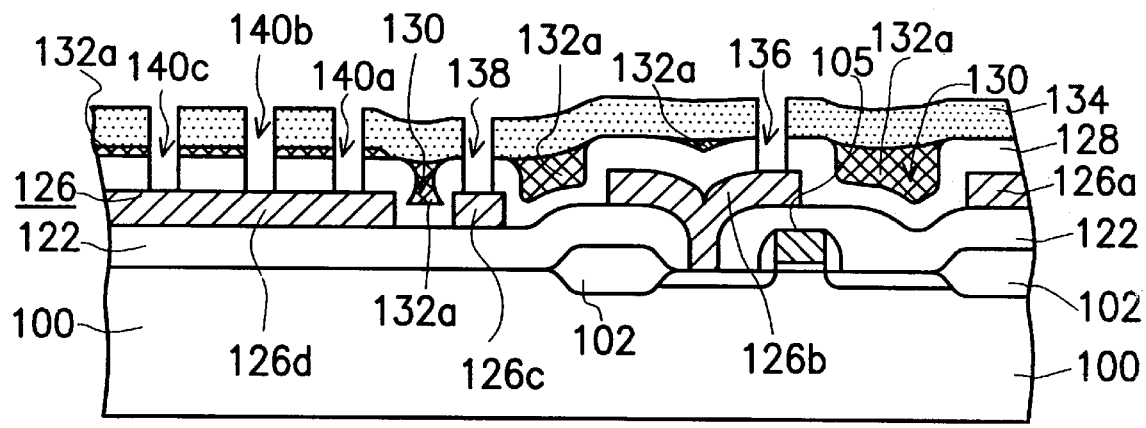
Figure 1F:
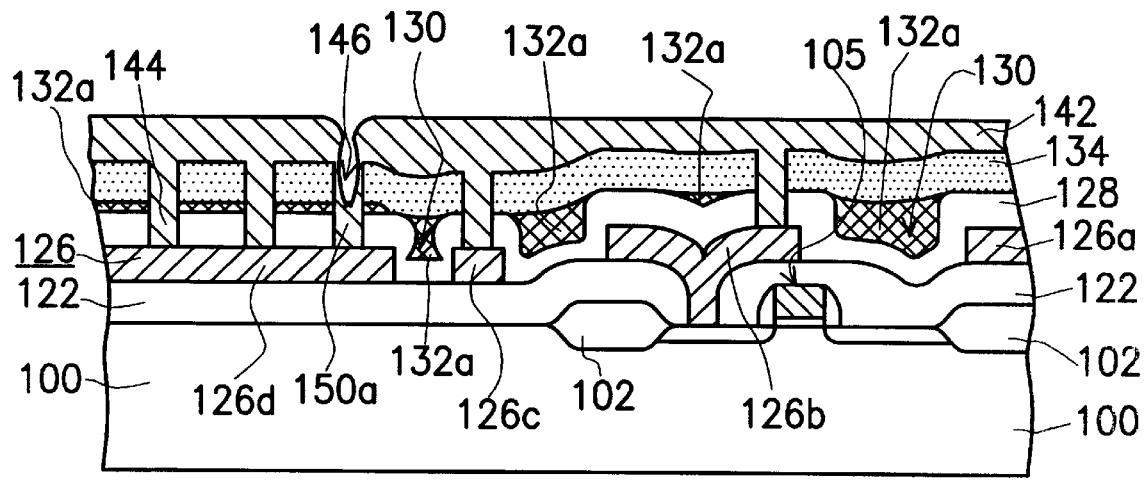
Figure 2A:
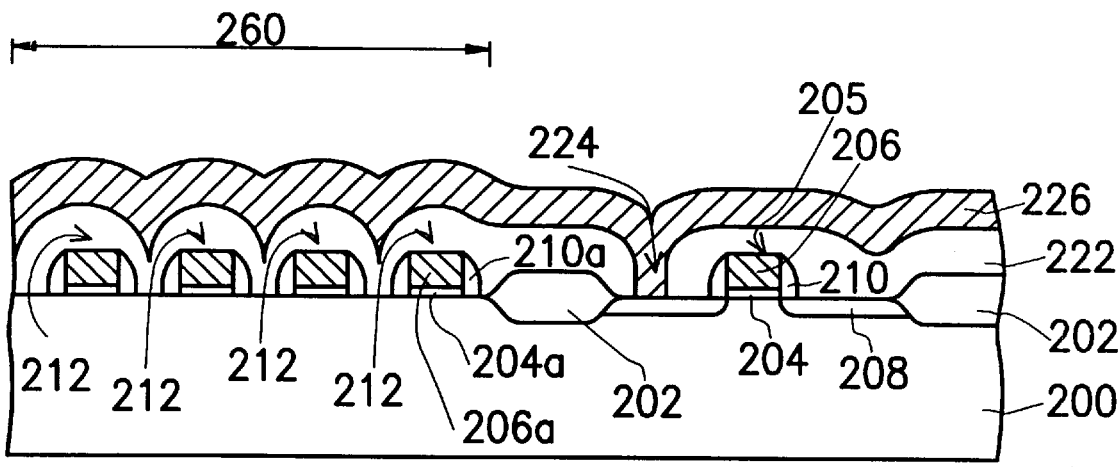
FIG. 2A to FIG. 2G are cross sectional views showing a method of forming a contact plug in a preferred embodiment according to the invention.

In FIG. 2A to FIG. 2G are cross sectional views showing a method of forming a contact plug without being poisoned according to the invention. In FIG. 2A, a substrate 200 comprising a field oxide layer 202, a field effect transistor 205, and a flat surface region 206 is provided. It is appreciated that a substrate with other isolation structures or active devices can also be applied. The transistor 205 comprises a gate and a source/drain region 208. The gate further comprises a gate oxide layer 204, a polysilicon layer 206 on the gate oxide layer 204, and a spacer 210 on a side wall of the polysilicon layer 206 and the gate oxide layer 204. A dummy pattern 212 is formed on the flat surface region 260. Preferably, the dummy pattern 212 can be formed while forming the gate. Therefore, the dummy pattern 212 may comprise a gate oxide layer 204a, a polysilicon layer 206a on the gate oxide layer 204a, and a spacer 210a. Or alternatively, the dummy pattern can be formed by a plurality of bumps. It is appreciated that the dummy pattern 212 can also be formed before or after the formation of the gate 205 of the transistor with different components. A first dielectric layer 222 with an opening 224 which exposes the source/drain 208 is formed on the substrate 200, the transistor 205, and the dummy pattern 212. A first metal layer 226 is formed on the first dielectric layer 222. As shown in the figure, the first metal layer 226 is formed with the topography of an uneven surface.

Figure 2B:
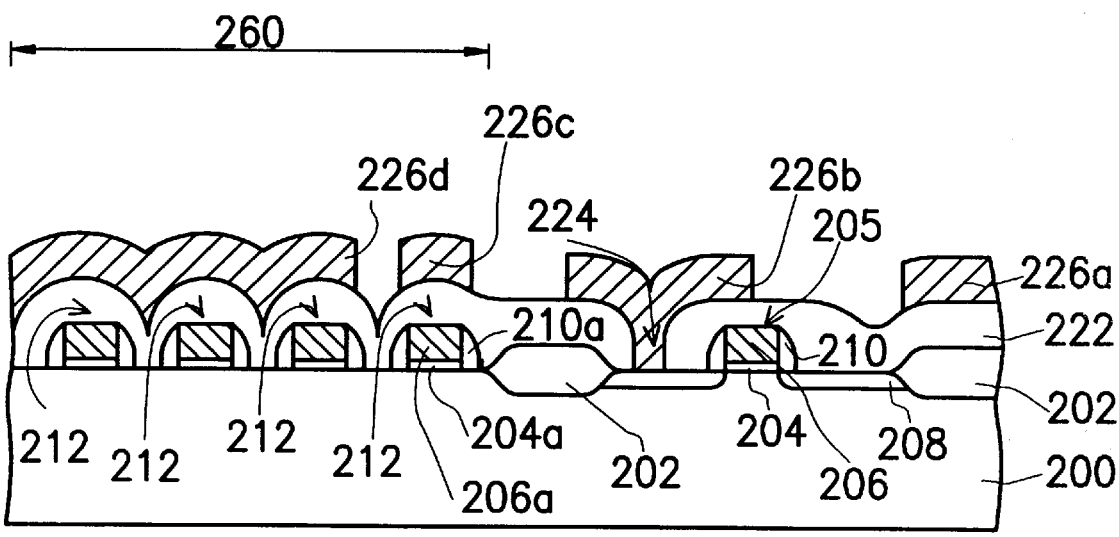

In FIG. 2B, the first metal layer 226 is patterned to expose a part of the dielectric layer 222. After being patterned, the resultant metal layer comprises metal layers 226a, 226b, 226c, and 226d. In this example, the metal layers 226a and 226b are formed over the transistor 205, and the metal layer 226 is coupled with the source/drain region 208. The metal layers 226c and 226d are formed on the region 260. Though the region 260 has a flat surface, due to the formation of the dummy pattern 212, the metal layers 226c and 226b are formed with an uneven surface.

Figure 2C:
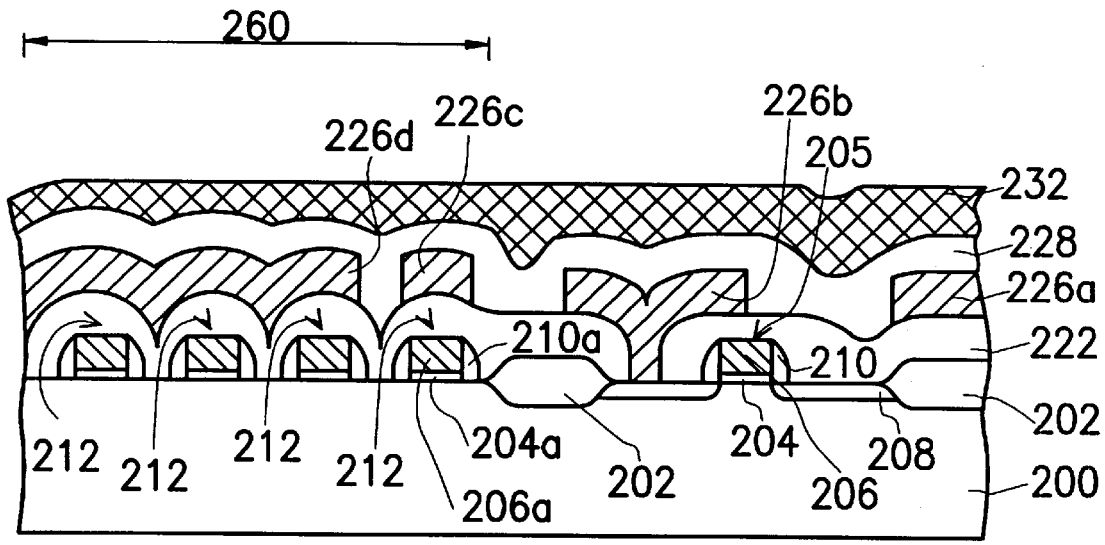

In FIG. 2C, a second dielectric layer 228 is formed on the metal layers 226a, 226b, 226c, 226d and the first dielectric layer 222. Though other material may also be adapted, preferably, the second dielectric layer 228 includes a silicon oxide layer formed by plasma-enhanced chemical vapor deposition (PECVD) with tetra-ethyl-ortho-silicate (TEOS) as a precursor. A spin-on-glass layer 232 is formed on the second dielectric layer 228. The spin-on-glass layer is then baked and cured.

Figure 2D:
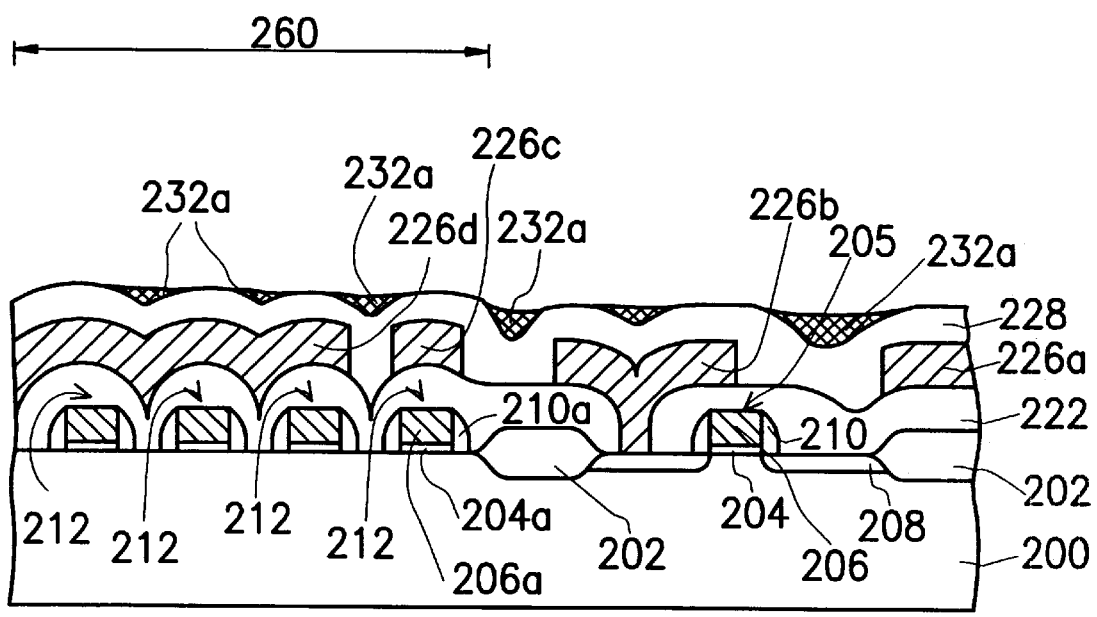

In FIG. 2D, the spin-on-glass layer 232 is etched back until the second dielectric layer 228 is exposed. A typical etch back process include a dry etch process with a mixture of carbon fluoride ($CF_4$), carbon tri-fluoride ($CHF_3$), and oxygen as an etching gas. As shown in the figure, since the second dielectric layer 228 is formed with an uneven surface, after the etching back process, the spin-on-glass 232a remains on the recesses of the second dielectric layer 228 only.

Figure 2E:
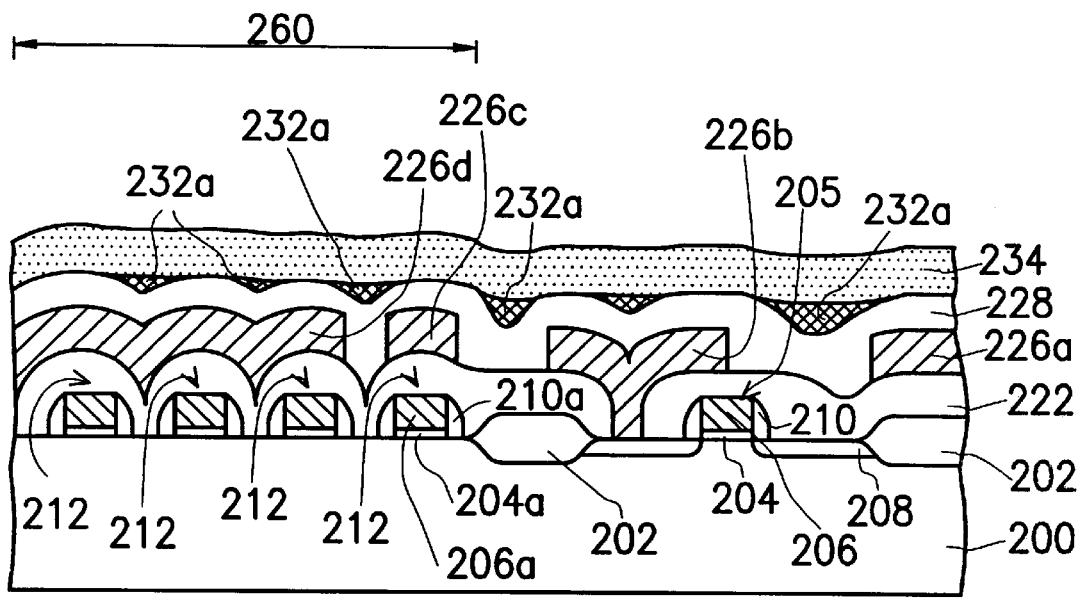

In FIG. 2E, a third dielectric layer 234 is formed on the second dielectric layer 228 and the spin-on-glass layer 232a. Though other material may also be adapted, preferably, the third dielectric layer 234 includes a silicon oxide layer formed by plasma-enhanced chemical vapor deposition (PECVD) with tetra-ethyl-ortho-silicate (TEOS) as a precursor. The second dielectric layer 228, the spin-on-glass layer 232a, and the third dielectric layer 234 compose a sandwich type spin-on-glass layer.

Figure 2F:
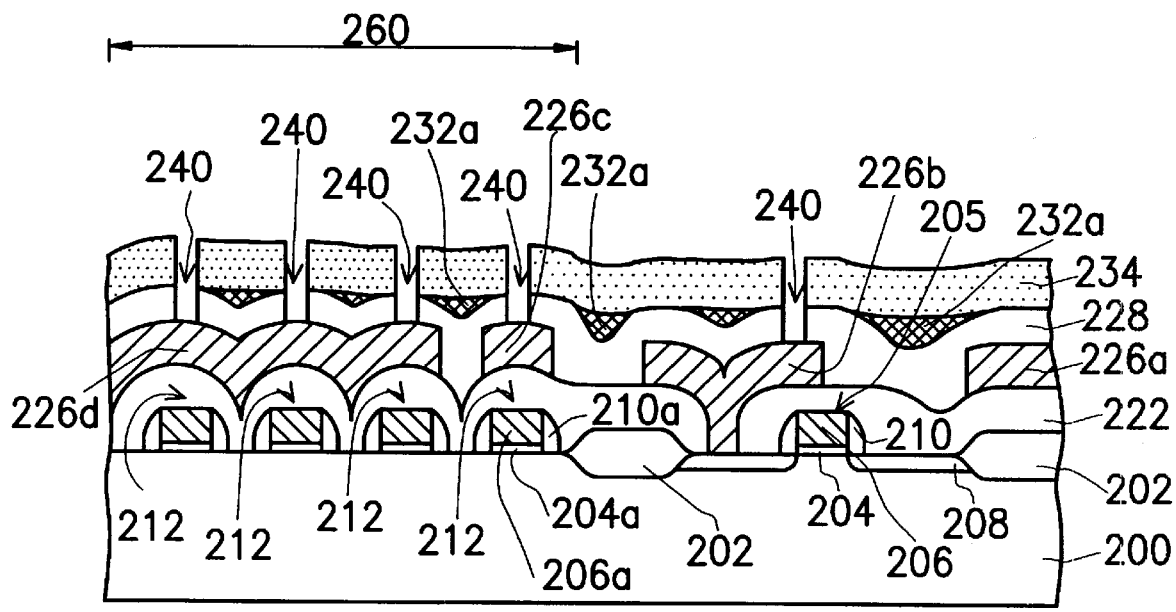

In FIG. 2F, using photolithography and etching process, the sandwich type spin-on-glass layer is patterned to form openings which expose a part of the metal layers 226a, 226b, 226c, and 226c.

Figure 2G:
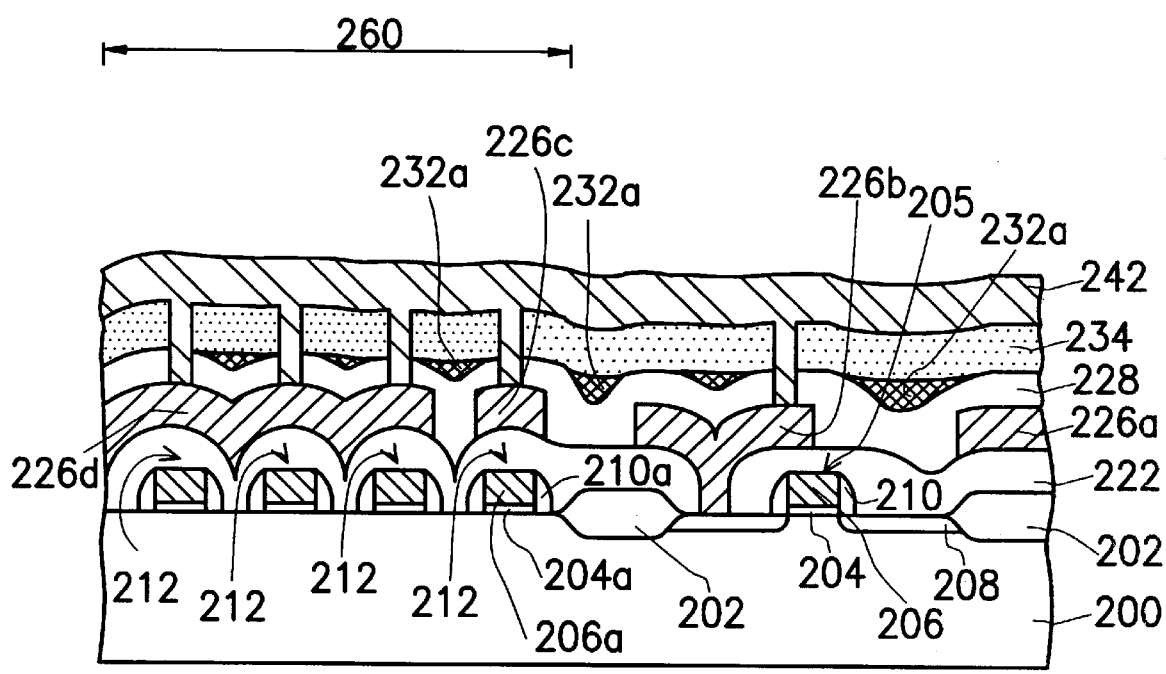

In FIG. 2G, a conductive layer 242 is formed to cover the sandwich type spin-on-glass layer and to fill the openings 240. The conductive layer 242 is then etched or polished to form contact plugs within the openings 240. A second metal layer is then formed on the sandwich type spin-on-glass layer and the contact plug. The formation of the contact plugs and the second metal layers are formed by the conventional method. Thus, the detailed description is omitted here.

During the process of forming the contact plugs, the spin-on-glass layer 232a is only remained to fill the recesses within the second dielectric layer 228. Therefore, while forming the openings 240, there is no worry that the spin-on-glass layer 232a is exposed to outgas. Thus, by the invention, the formation of a gas void, that is, the contact plug being poisoned, is prevented. Furthermore, without remaining the spin-on-glass layer 232a on the surface of the second dielectric layer 228, the aspect ratio of forming the openings 240 is reduced. As a consequence, a better step coverage is obtained.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a contact plug on a semiconductor substrate which comprises at least a flat surface region, comprising:

forming a dummy pattern on the flat surface region of the substrate;

forming a first dielectric layer on the dummy pattern and the substrate;

forming a first opening within the dielectric layer to expose a part of the substrate excluding the flat surface region;

forming and patterning a first wiring layer to cover a part of the first dielectric layer and to fill the first opening;

forming a second dielectric layer on the first wiring layer;

forming a spin-on-glass layer on the second dielectric layer;

etching back the spin-on-glass layer until the second dielectric layer is exposed;

forming a third dielectric layer on the spin-on-glass layer;

forming a second opening penetrating through the third dielectric layer, the spin-on-glass layer and the second dielectric layer; and filling the second opening with a contact plug.

2. The method according to claim 1, wherein the substrate further comprises a transistor which includes a gate and a source/drain region and an isolation structure.

3. The method according to claim 2, wherein the dummy pattern is formed while forming the gate.

4. The method according to claim 2, wherein the dummy pattern comprises at least a gate.

5. The method according to claim 2, wherein the exposed substrate comprises the source/drain of the transistor.

6. The method according to claim 1, wherein the second dielectric layer includes a silicon oxide layer formed by plasma-enhanced chemical vapor deposition with tetra-ethyl-ortho-silicate as precursor.

7. The method according to claim 1, wherein the third dielectric layer includes a silicon oxide layer formed by plasma-enhanced chemical vapor deposition with tetra-ethyl-ortho-silicate as precursor.

8. The method according to claim 1, further comprising the step of etching back the spin-on-glass layer by dry etch with a mixture of carbon fluoride as an etching gas.

9. The method according to claim 1, further comprising the s tep of etching back the spin-on-glass layer by dry etch with a mixture of carbon tri-fluoride as an etching gas.

10. The method according to claim 1, further comprising the step of forming a second wiring layer to cover the third dielectric layer and to couple with the first wiring layer via the contact plug.

11. A method for preventing a contact plug on a semiconductor substrate from being poisoned, comprising:

forming a dummy pattern on a region of the substrate;

forming a dielectric layer with an opening on the dummy pattern and the substrate, wherein the opening exposes a part of the substrate excluding the flat surface region;

forming a first wiring layer on the dielectric layer and to fill the opening;

forming a sandwich type spin-on-glass layer on the first wiring layer;

forming an opening penetrating through the sandwich type dielectric layer; and filling the opening with a contact plug.

12. The method according to claim 11, further comprising the step of forming a second wiring layer to cover the third dielectric layer and to couple with the first wiring layer via the contact plug.

13. The method according to claim 11, wherein the dummy includes a plurality of bumps.

* * * * *